United States Patent [19]

Harnden, Jr.

[11] 3,896,480

[45] July 22, 1975

[54] SEMICONDUCTOR DEVICE WITH HOUSING OF VARISTOR MATERIAL

[75] Inventor: John D. Harnden, Jr., Schenectady, N.Y.

[73] Assignee: General Electric Company, Syracuse, N.Y.

[22] Filed: May 30, 1973

[21] Appl. No.: 365,323

Related U.S. Application Data

[63] Continuation of Ser. No. 191,870, Oct. 22, 1971, abandoned.

[52] U.S. Cl. ........................ 357/80; 357/74; 357/76; 357/2; 357/51; 357/38; 357/75; 338/323

[51] Int. Cl. ............................ H01l 3/00; H01l 5/00

[58] Field of Search ........... 317/234, 41.1, 1, 3, 3.1, 317/4, 4.1, 10, 11, 22.1; 338/323

[56] References Cited

UNITED STATES PATENTS

| | | | |
|---|---|---|---|
| 3,308,352 | 3/1967 | Hutchins et al. | 317/234 |
| 3,668,551 | 6/1972 | Kondo | 317/234 G |
| 3,745,505 | 7/1973 | Turnbull et al. | 317/234 A |

FOREIGN PATENTS OR APPLICATIONS

| | | | |
|---|---|---|---|
| 883,862 | 12/1961 | United Kingdom | 317/234 G |
| 1,198,563 | 7/1970 | United Kingdom | 338/323 |
| 831,691 | 1/1970 | Canada | 317/234 G |

*Primary Examiner*—Andrew J. James
*Attorney, Agent, or Firm*—Robert J. Mooney; Douglas E. Stoner

[57] ABSTRACT

A PN junction semiconductor device degradable by the application of excess voltages and voltage transients is provided integral built-in protection against such degradation by constituting what is normally the insulative portion of the housing for such device of a body of metal oxide varistor material, such varistor body housing element serving as a relatively low resistance dynamic shunt for excess voltages and voltage transients and thereby stabilizing both the dynamic and DC peak inverse voltage characteristic, as well as other electrical characteristics, of the protected device.

7 Claims, 8 Drawing Figures

INVENTOR:
JOHN D. HARNDEN, JR.
BY Robert J. Mooney
HIS ATTORNEY.

SEMICONDUCTOR DEVICE WITH HOUSING OF VARISTOR MATERIAL

This is a continuation, of application Ser. No. 191,870, filed Oct. 22, 1971, and now abandoned, titled "Semiconductor Device with Housing of Varistor Material."

The present invention relates to improvements in semiconductor devices of the type which are susceptible to degradation by excess voltages and voltage transients, such as PN junction rectifiers, thyristors, and transistors. More particularly, this invention relates to the provision in such semiconductor devices of integral improved protection against such excess voltage and transients.

Semiconductor devices such as PN junction rectifiers, thyristors, and transistors are susceptible to erratic, degraded, or faulty operation, and may suffer temporary non-destructive or even destructive breakdown, as a result of the application of transient voltages of excessive voltage magnitudes. Consequently, in the art of designing such devices and the circuits in which they are intended to operate, it has been recognized that it is often desirable to provide suitable circuit protective means for suppressing or blocking the application of such excessive voltages to such semiconductive devices. For example, it is not uncommon to provide, in association with such semiconductor devices, so-called "snubber" circuits consisting of series resistor-capacitor networks or parallel resistor-capacitor networks for snubbing, i.e. suppressing or reducing, the time rate of change and excursion amplitude of voltage transients to which the semiconductor device may be subjected.

However, a number of recognized disadvantages inhere to the use of various kinds of conventional snubber circuits. For example, in series resistor-capacitor snubber networks the usually-required large capacitance value impairs circuit efficiency and adds substantially to circuit cost. On the other hand, parallel resistance-capacitor snubber circuits have the disadvantage of continuous power dissipation in the resistor elements, a problem which can be mitigated only by the use of additional circuit elements which in turn further add to the complexity and expense of the complete circuit.

Other forms of excess voltage protection for semiconductor devices are also known, including the provision in circuit with such devices of voltage-variable resistors, or "varistors" as they are frequently called. Such varistors manifest the property that their resistivity and resistance is extremely high for applied voltages of less than a so-called breakover voltage level, and declines abruptly as a highly nonlinear function of voltage as the applied voltage reaches and attempts to exceed the break-over level. This non-linear variation in resistance with applied voltage has been expressed by the formula:

$$I = \left(\frac{V}{C}\right)^{\text{alpha}}$$

where $V$ is the voltage across the varistor, $I$ is the current flowing through it, $C$ is a constant corresponding to the voltage at a given current, and the exponent alpha is a numerical value greater than 1. The extent to which the resistance variation with voltage and current departs from Ohm's law, i.e. the degree of nonlinearity of such a varistor, is proportional to the size of the exponent alpha.

Such varistors may be used alone or in company with paralleled capacitors for snubbing and voltage-clipping protection of semiconductor devices, or in series with other types of voltage-variable resistance devices such as gaps. But the efficacy of their use in such applications depends upon a variety of factors, such as the extent of the range over which their resistance can vary responsive to differences in applied voltage, the amount of leakage current they pass when subjected to voltages below the magnitude requiring snubbing or clipping action, their corresponding steady state power dissipation, the effectiveness of their voltage clipping or clamping action, their ability to respond to very high rates of change of applied voltage, their ability to absorb or shunt acceptable levels of energy without temporary or permanent degradation, and their physical size for a given energy handling capability.

The present invention arises from the discovery that certain types of available varistor materials not only satisfy the above outlined criteria for desired excess voltage and voltage transient protection of semiconductor devices to a superior degree, but also possess additional properties enabling them to be incorporated directly and integrally as housing elements directly enclosing the PN junction semiconductor body of such semiconductor devices. Such varistor bodies can thus serve as part of or the entirety of what is normally considered the insulative portion of the housings of such semiconductor devices, and can thereby provide permanent lifetime excess voltage and voltage transient protection for such semiconductor devices quite independent of whatever type of circuit the devices may be associated with or incorporated into. Additionally, the incorporation of such protective varistor bodies directly into the housings of the protected semiconductor devices enables certain electrical characteristics of the resulting device to be brought under precise control and predetermined by the device designer to a degree heretofore unattainable. For example, the varistor housing element can serve to determine precisely the peak inverse voltage capability of the device, as well as predetermining both forward and reverse leakage current characteristics.

Accordingly, it is one object of my invention to provide integrally in the housing of a PN junction semiconductor device such as a rectifier, transistor, or thyristor, a body of varistor material so arranged and connected as to afford automatic protection against excess voltages and voltage transients which would otherwise have a deleterious, degrading, or destructive effect on the semiconductor device.

Another object is to provide, in a semiconductor device of the foregoing character, automatic over-voltage protection which is integral, mechanically rugged, and of low cost, and which can be inexpensively built into the device at the time of its original manufacture and does not significantly increase either the size or weight of the device.

Another object is to provide an improved semiconductor device of the foregoing character having integral voltage-transient protection providing enhanced and more precisely predeterminable performance characteristics, and thereby allowing design tradeoffs in terms of broadened tolerances on other device parameters as well as other parameters and features of circuits in which such a device may be used.

Another object is to provide an improved semiconductor device of the foregoing character having various electrical characteristics such as reverse and forward leakage current characteristics, and peak inverse voltage blocking characteristics, which are controllable and predeterminable to a degree heretofore unattainable, and whose variation with temperature is also substantially decreased in comparison with prior art devices.

These and other objects of the present invention will be more fully apparent from the following description and the accompanying drawing wherein:

FIG. 2 is a fragmentary sectional view of one embodiment of a semiconductor device constructed in accordance with the present invention;

FIGS. 3 through 8 are fragmentary sectional views of various alternative embodiments of my invention.

Figure 1:
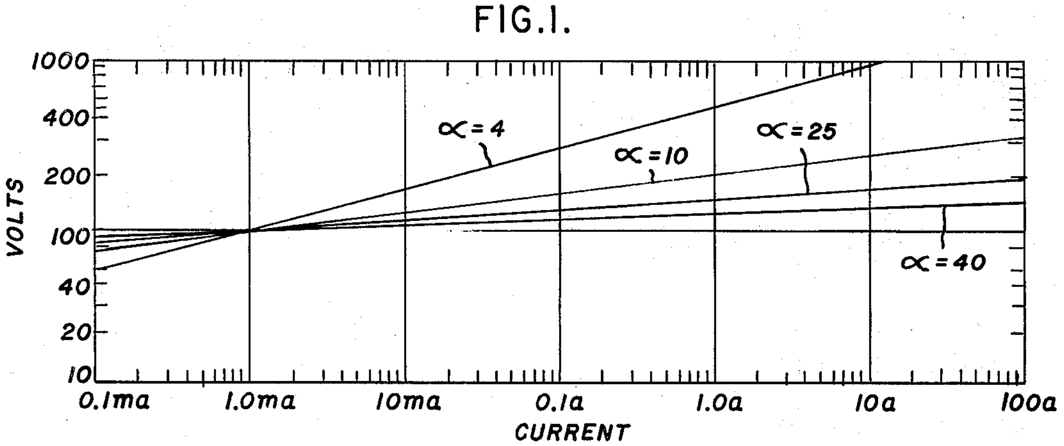
FIG. 1 is a graph, on a log-log scale, of nonlinear resistance characteristics of various varistor materials useful in accordance with the teaching of the present invention.
Figure 1:
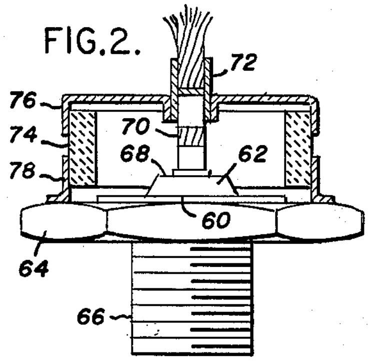
Figure 1:
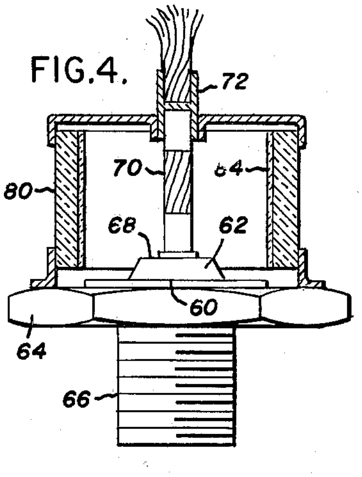
Figure 1:
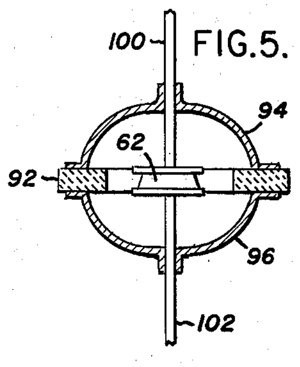
Figure 1:
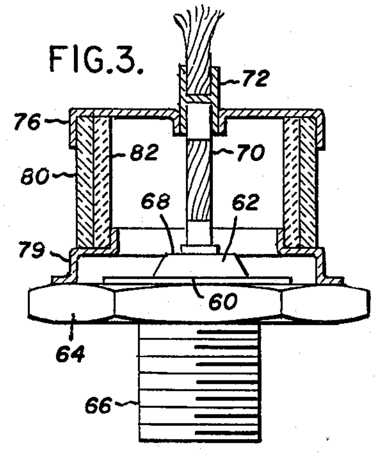
Figure 1:
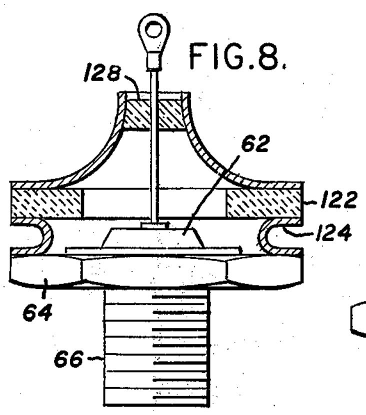
Figure 1:
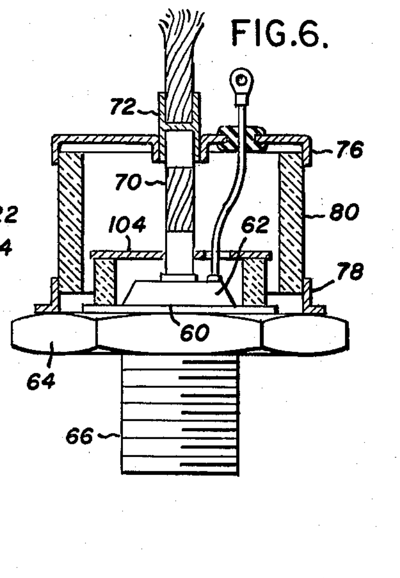
Figure 1:
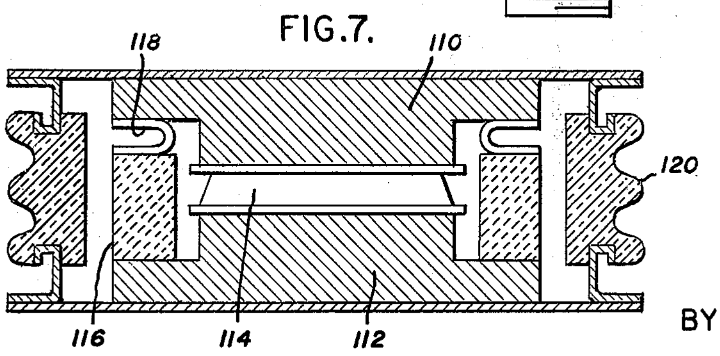

Referring to the drawing, FIG. 1 shows, in a graph of voltage versus current characteristics on a log-log scale, the nonlinear or exponential resistance characteristics exhibited by various kinds of varistor material having exponents, alpha, of various different magnitudes. It will be evident from FIG. 1 that the larger the alpha, the greater is the nonlinearity of the voltage-current relationship and hence the greater is the voltage-limiting of snubbing capability of varistors constructed of bodies of such varistor material.

In FIG. 1 the upper curve showing an alpha of 4 is typical for silicon carbide varistors and the remaining three curves showing alphas of 10, 25, and 40 respectively are characteristic of varistors fabricated from certain respective known mixtures of metal oxides. The ordinate of the graph represents voltage applied to a specific body of varistor material, and the abscissa represents the current flow through the body of varistor material responsive to the applied voltage. The graph illustrates the fundamental characteristic of the various kinds of varistor material, namely that the resistance exhibited is quite high at low current levels and becomes progressively smaller in a nonlinear fashion with increasing current levels.

My invention resides in the discovery that certain known formulations of varistor material, consisting essentially of certain mixtures of various metal oxides, and having high alphas in excess of 10 or above in the current range of interest, can be formed into bodies which can be incorporated directly and integrally into, and as a part of or the entirety of, the insulative portion of the protective and enclosing housing for the PN junction semiconductor bodies of semiconductive devices, and when so integrally incorporated provide superior excess voltage and voltage transient protection characteristics for such semiconductor devices. The varistor materials from which the housings of my invention are made comprise formed mixtures of metal oxide compositions which exhibit relatively high alphas of 10 or above, within the current density range of $10^{-3}$ to $10^{2}$ amperes per square centimeter. Such housings derive their nonlinear resistance properties from the bulk material constituting the varistor bodies of which they are formed.

Varistor materials and varistor bodies having such alphas, and consisting of predominantly zinc oxide with one or more other metal oxides, are disclosed, for example, in Canadian Pat. No. 831,691 issued Jan. 6, 1970, to which reference may be had for a more detailed disclosure of various precise formulations of such varistor materials as well as techniques and processes for making a variety of varistor bodies thereof. Such varistor bodies may comprise a sintered or otherwise formed body of a composition comprising predominantly zinc oxide and from 1/10th to 1 mol percent of bismuth oxide. Another useful additive consists of 0.05 to 10 mol percent of an oxide of a metal from the group consisting of cobalt, manganese, indium, antimony, titanium, boron, aluminum, tin, barrium, nickel, molybdenum, tantalum, iron, and chromium. Such varistor bodies may be easily electroded or provided with surface metallization in selected surface areas. The metallization can be made, for example, of an electroless-plated or electrolytically-plated film of silver, copper, nickel, zinc, or tin, a vacuum-evaporated film of aluminum, zinc, tin, or indium, or a metallized film of copper, tin, zinc, or aluminum. For ease in assembly of the varistor bodies with relation to the other metallic members such as metallic members of a semiconductor device housing, such varistor bodies may be metallized or electroded in any suitable fashion such as, for example, by low temperature soldering, by application of pressure contacts, or by forming a metallized surface on the varistor body for example by firing a thin layer of a frit of particles of glass and a conductive material such a silver onto the varistor body surface.

Varistor bodies of the foregoing composition and for use in accordance with the present invention can be prepared by well known ceramic technique. The various ingredients of the starting material, of a composition or compositions as above described, are first mixed in a wet mill to produce a homogeneous mixture, then dried, mixed with a suitable binder such as water or polyvinyl alcohol, and pressed in a mold into desired shapes at pressures of from 100 to 1,000 kilograms per square centimeter. The pressed bodies may then be sintered in air for one to three hours, at temperatures, for example, in the range of 800° to 1,500°C, and then furnace-cooled to room temperature.

I have found that varistor bodies made as above described and having alphas of 10 or above in the current range of interest are readily electrodable and joinable to metallic members, are sufficiently small in physical size in relation to the amount of energy required to be dissipated in the case of excess voltage and voltage transient protection of semiconductor devices of modern commercial power ratings, and have a sufficient mechanical strength, structural integrity, and hermeticity, as to be able to constitute directly and integrally a part of the entirety of the enclosure or housing for such semiconductor body. Since such varistor bodies are polycrystalline and derive their electrical properties from the bulk material, and may be readily and precisely shaped and sized, it will be evident that they may be precisely shaped and dimensioned to afford a high degree of control and predetermination of electrical characteristics desired for the completed semiconductor devices in which they will be installed.

FIG. 2 shows one form of exemplary PN junction semiconductor device constructed in accordance with my invention. The semiconductor device of FIG. 2 is a rectifier including a disc-shaped body of semiconductor material such as silicon having at least one PN junction. The body 62 is manufactured by conventional techniques and the junction is not shown in an effort to preserve clarity in the Figure. PN junctions referred to in the discussion of the subsequent Figures are also omitted from the Figures to preserve clarity. As shown in FIG. 2, one major face 60 of the semiconductor body 62 is electrically connected to an exterior bottom metal electrode 64 which may be provided with an axially extending threaded stud 66. The other major face 68 of the semiconductor body 62 is electrically connected through an internal coaxial lead 70 to a top external electrode 72. The top and bottom external electrodes are mechanically spaced and electrically insulated from each other by an annular insulative sleeve 74 which is sealingly joined adjacent its top and bottom ends to flanges 76, 78 extending from the respective top and bottom electrodes. The sleeve 74 consists of varistor material having an alpha above 25 and is hermetically sealed to the top and bottom external electrodes 64, 72 at flanges 76, 78 so as to provide an integral hermetic enclosure for the semiconductor body. The spacing of flanges 76 and 78 along the surface of varistor body 74 permits precise control of the effective electrical length of body 74.

An alternative embodiment of my invention is shown in FIG. 3, in which the semiconductor device further includes a conventional annular ceramic housing member 80 of aluminum oxide or the like, within which is concentrically situated an annular member 82 of metal oxide varistor material, having an alpha above 10 in the current range of interest, and extending between the top electrode and bottom electrode and making electrical contact at its ends with each of said electrodes through respective metallic flanges 76 and 79. With this arrangement of parts in the devices of FIGS. 2 and 3, the annular varistor member conducts excess current and voltage in a shunting path around the PN junction semiconductor body itself, and thereby prevents the shunted semiconductor body from being subjected to excess voltages and voltage transients and the degrading effects thereof.

The thickness of the varistor body, i.e. its dimension between the electrodes in FIGS. 2 and 3, as previously explained, determines the voltage at which it begins to conduct large amounts of current, i.e. the stabilization voltage, and hence the varistor body is by design provided with a thickness corresponding to the stabilization voltage which is desired. If this thickness, as measured in the axial direction, is less than the distance between the top electrode and bottom electrode, then a conductive spacer may be provided in conjunction with the varistor body which, together with the varistor body, forms a complete conduction path between the top electrode and bottom electrode of the semiconductor device. Moreover, such a spacer can serve to facilitate maintaining exact overall physical dimensions for purposes such as conformity to industry standards, while allowing the varistor body itself to be dimensioned to achieve exact voltage grades or other electrical characteristics.

It will be evident from FIGS. 2 and 3 that the varistor body housing element according to my invention not only precisely controls peak inverse voltage characteristics, but also controls and stabilizes both forward and reverse leakage current, as well as forward blocking voltage when the semiconductor body 62 is a thyristor.

The cross-sectional area of the varistor body of FIGS. 2 and 3 as measured in a plane normal to the axis of the semiconductor device, is not critical but should be sufficiently large to accommodate whatever maximum currents may be shunted by the varistor body without excessive heating or other degradation. Furthermore, since the capacitance of the varistor body is likewise proportional to its cross-sectional area, the area can be so chosen as to provide an inherent shunt capacitance in the varistor body which appropriately matches the dynamic electrical characteristics of the PN junction semiconductor body being protected.

FIGS. 4 through 8 show various alternative structural embodiments of my invention. FIG. 4 shows a modified form in which the varistor body is provided in the form of a coating 84 on the interior cylindrical surface of the conventional annular insulative sleeve 80 constituting the remainder of the housing. The coating 84 may have any desired thickness sufficient to accommodate the shunting currents to be encountered, and the axial dimension of the coating will determine, and should be sufficient to accommodate, a stabilization or breakover voltage of the contemplated magnitude. FIG. 5 shows a device of the lead-mounted type, wherein the varistor body is an annular element 92 sealed between flanges 94, 96 extending from electrodes 100, 102. FIG. 6 is a three-leaded thyristor device wherein the varistor body is an internal sleeve extending between electrode 64 and a flange 104 on electrode 72. FIG. 7 shows a disc-shaped device having electrodes 110, 112 between which a semiconductor body 114 is mounted, and provided with an internal varistor body 116 joined to electrode 112 and through resilient metallic annular member 118 to electrode 110. An external insulative member 120 completes the housing. FIG. 8 shows the varistor element 122 as annular and sealed to a resilient metallic ring 124 joined to electrode 64. The top lead 126 from the semiconductor body 62 is brought out through an insulative bushing 128 having a metal flange sealed to the top of varistor element 122.

In the operation of semiconductor devices constructed according to my invention, under normal operating conditions the body of varistor material comprising part of all of the non-metallic housing element is an insulator, and hence essentially no current flows through it. The voltage breakover value of the varistor body, that is the voltage level at which it begins to conduct appreciable current, can be adjusted or predetermined in accordance with the thickness of the varistor body as measured in the direction of current flow. If a voltage in excess of the breakover value is then applied to the body a current conduction will take place through it sufficient to maintain the device voltage at a safe level. Thus the varistor body serves to shunt away from the PN junction semiconductor body large volumes of current during periods of over voltage without any arcing or flashover or other destructive or degrading phenomena.

As will be appreciated, the incorporation of such varistor material directly into the housing of the semiconductor device allows or enables the peak inverse voltage rating of the device to be specified much higher than would otherwise be possible without the transient protection available from the varistor material. Likewise for a particular specified peak inverse voltage rating, the incorporation of the varistor material directly in the housing of the device permits relaxed tolerances on other specifications of the device, such as, for example, special features sometimes provided to minimize the possibility of surface breakdown on the semiconductor body under conditions of excessive voltage.

Still further advantages of the present invention are that the varistor body responds to voltages of either polarity, and hence is uniformly acceptable in the housing irrespective of the polarity arrangement of the PN junction semiconductor body. Also, several such varistor-housed devices can be connected in series with no other external components required to insure desired voltage sharing, whether of equal or unequal voltages, in a series string.

Since the varistor material is fabricated as a pressed ceramic powder, it can easily be pressed into a variety of shapes of various sizes. The characteristics of the varistor material are believed to be determined by considerations of grain or crystal size, grain composition, grain boundary composition and grain boundary thickness, and in any event are controllable by means of the ceramic fabrication process and choice of original ingredients, as taught by Canadian Pat. No. 831,691.

The thickness of the varistor body as measured in the direction of current flow through it is determined primarily by the requisite voltage rating of the body. For example varistor bodies formulated in accordance with the teachings of above-mentioned Canadian Pat. No. 831,691 and having voltage ratings of 240 and 480 volts have thicknesses of 0.10 and 0.20 inches, respectively.

The provision of the voltage clipping or snubbing varistor body directly as an integral part of the semiconductor device housing in accordance with the present invention minimizes any parasitic inductance which would introduce delay in the voltage suppressing action desired, so that the fastest possible reaction time of the varistor material in the suppression of excess voltages is thereby obtained with consequent optimum protection of the semiconductive body of the semiconductor device. In this way the varistor element enables the peak inverse voltage rating to be not only a DC rating, but also fixes the dynamic rating of the device at the same value as the DC rating. So the designer can have the assurance that the PIV rating will be essentially invariant regardless of the circuit application. The voltage rating of the varistor body may be readily changed simply by incresing its thickness and the current rating may be readily modified simply by increasing its cross sectional area in a plane normal to the direction of shunt current flow. Moreover, since the varistor body is polycrystalline, its temperature coefficient is several times lower than single crystal semiconductor material, hence its electrical characteristics, such as leakage current are relatively temperature-invariant.

For enhanced heat dissipation, the varistor body may have one or more of its side walls corrugated or may be joined to suitable fins or other highly thermally conductive heat sink members for the purposes of optimizing withdrawal of heat from the varistor material itself. Inductances cause voltage overshoots during voltage transients.

It will be appreciated by those skilled in the art that the invention may be carried out in various ways and may take various forms and embodiments other than the illustrative embodiments heretofore described. Accordingly, it is to be understood that the scope of the invention is not limited by the details of the foregoing description but will be defined in the following claims.

What I claim as new and desire to secure by Letters Patent of the United States is:

1. In combination with a semiconductor device including a body of PN junction semiconductor material having at least two contacts across which a voltage may be applied, a housing for said body of semiconductor material, an excess-voltage protection body of metal oxide varistor material having an alpha in excess of 10 constituting an integral part of said housing, respective electrodes located on spaced regions of said varistor body, and means forming electrical connections between said contacts and said electrodes.

2. The combination recited in claim 1 wherein said varistor material comprises a coating on at least a portion of a surface of an insulative portion of said housing.

3. The combination recited in claim 1 wherein said varistor material is predominantly zinc oxide.

4. A thyristor comprising a body of semiconductor material having regions of one and the opposite conductivity type, separated by pN, an enclosure for said body including conductive portions connected to selected regions of said body and an insulative portion separating said conductive portions, a body of metal oxide varistor material having an alpha in excess of 10 integrally associated with at least a part of said insulative portion, and means forming respective electrical connections between said conductive portions and spaced regions of said varistor body, said varistor body being dimensioned in relation to the spacing between said electrical connections thereto so as to control and stabilize the forward and reverse leakage currents through said thyristor as well as the peak inverse voltage of said thyristor.

5. In a semiconductor device including a body of PN junction semiconductor material having at least one PN junction, respective spaced electrodes electrically connected to spaced locations on the surface of said body of semiconductor material, and a housing member for said semiconductor body extending between said electrodes and comprising a body of metal oxide varistor material having an alpha in excess of 10, said body of varistor material being dimensioned to provide a predetermined breakover voltage characteristic, leakage current characteristic, and shunt capacitance for the PN junction semiconductor body.

6. A semiconductor device comprising a body of PN junction semiconductor material having at least one PN junction, spaced electrodes electrically connected to spaced locations on the surface of said body of semiconductor material, and also comprising a housing for said semiconductor body, said housing extending between said electrodes and said housing comprising means for establishing predetermined breakover voltage and predetermined peak inverse voltage characteristics of said semiconductor device.

7. A semiconductor device according to claim 6 wherein said means for establishing predetermined breakover voltage and predetermined peak inverse voltage characteristic comprises a body of metal oxide varistor material.

* * * * *